(12) United States Patent
Park

(10) Patent No.: US 11,495,319 B2
(45) Date of Patent: Nov. 8, 2022

(54) MEMORY SYSTEM, MEMORY CONTROLLER, AND METHOD FOR OPERATING MEMORY SYSTEM PERFORMING INTEGRITY CHECK OPERATION ON TARGET CODE WHEN VOLTAGE DROP IS DETECTED

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/162,544

(22) Filed: Jan. 29, 2021

(65) Prior Publication Data
US 2022/0020447 A1    Jan. 20, 2022

(30) Foreign Application Priority Data

Jul. 20, 2020  (KR) .................. 10-2020-0089320

(51) Int. Cl.
*G11C 29/42* (2006.01)
*G11C 29/50* (2006.01)
*G11C 29/02* (2006.01)
*G11C 29/12* (2006.01)

(52) U.S. Cl.
CPC ............ *G11C 29/42* (2013.01); *G11C 29/021* (2013.01); *G11C 29/12005* (2013.01); *G11C 29/50004* (2013.01)

(58) Field of Classification Search
CPC . G11C 29/42; G11C 29/021; G11C 29/12005; G11C 29/50004
See application file for complete search history.

(56) References Cited

U.S. PATENT DOCUMENTS 8,742,805 B2 *  6/2014  Lee ...................... H03L 7/00
                                                                327/143
2008/0301498 A1 * 12/2008  Hsu ................. G06F 11/0793
                                                                714/23

FOREIGN PATENT DOCUMENTS

KR    10-1999-0078357    10/1999
KR        10-1986872     6/2019

* cited by examiner

*Primary Examiner* — Vanthu T Nguyen
(74) *Attorney, Agent, or Firm* — IP & T Group LLP

(57) ABSTRACT

Embodiments of the present disclosure relate to a memory system, a memory controller, and a method of operating the memory system. According to embodiments of the present disclosure, a memory system may perform an integrity check operation on target code when information indicating whether a supply voltage supplied to a memory system is maintained at or below a first level for a first unit time is received from a voltage drop detector configured to sense a level of the supply voltage. Accordingly, the memory system is capable of minimizing the time of operation in the state in which a bit-flip occurs and preventing a problem in which irrecoverable data is recorded in a memory device due to malfunction of firmware.

9 Claims, 12 Drawing Sheets

T1 >= TU1 : Perform integrity check operation on target code

MEMORY SYSTEM, MEMORY CONTROLLER, AND METHOD FOR OPERATING MEMORY SYSTEM PERFORMING INTEGRITY CHECK OPERATION ON TARGET CODE WHEN VOLTAGE DROP IS DETECTED

CROSS REFERENCE TO RELATED APPLICATION

The present application claims priority under 35 U.S.C. 119(a) to Korean patent application number 10-2020-0089320, filed on Jul. 20, 2020, which is incorporated herein by reference in its entirety.

BACKGROUND OF THE INVENTION

1. Field of the Invention

Embodiments of the present disclosure relate to a memory system, a memory controller, and a method for operating the memory system.

2. Description of the Prior Art

A memory system, e.g., a storage device, stores data on the basis of a request from a host, such as a computer, a mobile terminal (for example, a smartphone or a tablet), or any of various other electronic devices. The memory system may be a type of device that stores data in a magnetic disk such as a hard disk drive (HDD), or a type of device that stores data in a nonvolatile memory such as a solid state drive (SSD), a universal flash storage device (UFS), or an embedded MMC (eMMC) device.

The memory system may further include a memory controller for controlling the memory device. The memory controller may receive a command from the host and, on the basis of the received command, may execute or control operations for reading, writing, or erasing data in a volatile memory or a nonvolatile memory included in the memory system. The memory controller may drive firmware for performing a logical operation for controlling such operations.

Meanwhile, bit-flips may occur in code existing in the memory system while the memory system performs an operation of reading, writing, or erasing data from or to the memory device, which may cause the memory system to malfunction. There may be various causes of bit-flips, but the most common cause is instability of supply voltage due to the occurrence of transient peak current.

SUMMARY OF THE INVENTION

Embodiments of the present disclosure may provide a memory system, a memory controller, and a method of operating the memory system capable of reducing or minimizing the time of operation in the state in which a bit-flip occurs.

In addition, embodiments of the present disclosure may provide a memory system, a memory controller, and a method of operating the memory system capable of preventing a problem in which irrecoverable data is recorded in a memory device due to malfunction of firmware.

In one aspect, embodiments of the present disclosure may provide a memory system including a memory device and a memory controller.

The memory controller may communicate with the memory device, and may execute firmware in order to control the memory device.

When information indicating that the supply voltage supplied to the memory system is maintained at or below a first level for a first unit time is received from the voltage drop detector configured to sense the level of the supply voltage, the memory controller may perform an integrity check operation on the target code stored in the memory device.

In this case, the target code may be firmware code.

The memory controller may perform an error handling operation in order to prevent malfunction of the firmware when a number of times the integrity check operation on the target code fails is greater than or equal to a threshold number.

For example, the error handling operation may include stopping execution of the firmware.

As another example, the error handling operation may include correcting an error occurring in the target code.

The memory controller may perform the error handling operation when information indicating that the supply voltage is maintained at or below a second level for a second unit time is received from the voltage drop detector.

In another aspect, embodiments of the present disclosure may provide a memory controller including: a memory interface configured to communicate with a memory device; and a processor configured to communicate with the memory device through the memory interface and execute firmware in order to control the memory device.

The processor may communicate with the memory device, and may execute the firmware in order to control the memory device.

The processor may perform an integrity check operation on target code stored in the memory device when information indicating that a supply voltage supplied to a memory system is maintained at or below a first level for a first unit time is received from a voltage drop detector configured to sense a level of the supply voltage.

In this case, the target code may be firmware code.

The processor may perform an error handling operation in order to prevent malfunction of the firmware when the number of times the integrity check operation on the target code fails is greater than or equal to a threshold number.

For example, the error handling operation may include stopping execution of the firmware.

As another example, the error handling operation may include correcting an error occurring in the target code.

The processor may perform the error handling operation when information indicating whether the supply voltage is maintained at or below a second level for a second unit time is received from the voltage drop detector.

In another aspect, embodiments of the present disclosure may provide a method of operating a memory system including a memory device.

The method of operating the memory system may include a step of detecting the level of a supply voltage supplied to the memory system through a voltage drop detector.

In addition, the method of operating the memory system may include a step of receiving, from the voltage drop detector, information indicating whether the supply voltage is maintained at or below a first level for a first unit time.

In another aspect, embodiments of the present disclosure may provide an operating method of a controller.

The operating method may include a step of performing an error handling operation on firmware code depending on a result of an integrity check on the firmware code when a supply voltage remains below a first threshold for a first amount of time.

The operating method may include a step of performing the error handling operation regardless of the integrity check when the supply voltage remains below a second threshold for a second amount of time.

The first threshold may be higher than the second threshold.

According to embodiments of the present disclosure, it is possible to minimize the time of operation in the state in which a bit-flip occurs.

In addition, according to embodiments of the present disclosure, it is possible to prevent a problem in which irrecoverable data is recorded in a memory device due to malfunction of firmware.

BRIEF DESCRIPTION OF THE DRAWINGS

The above and other aspects, features, and advantages of the present disclosure will be more apparent from the following detailed description taken in conjunction with the accompanying drawings.

DETAILED DESCRIPTION OF EMBODIMENTS

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
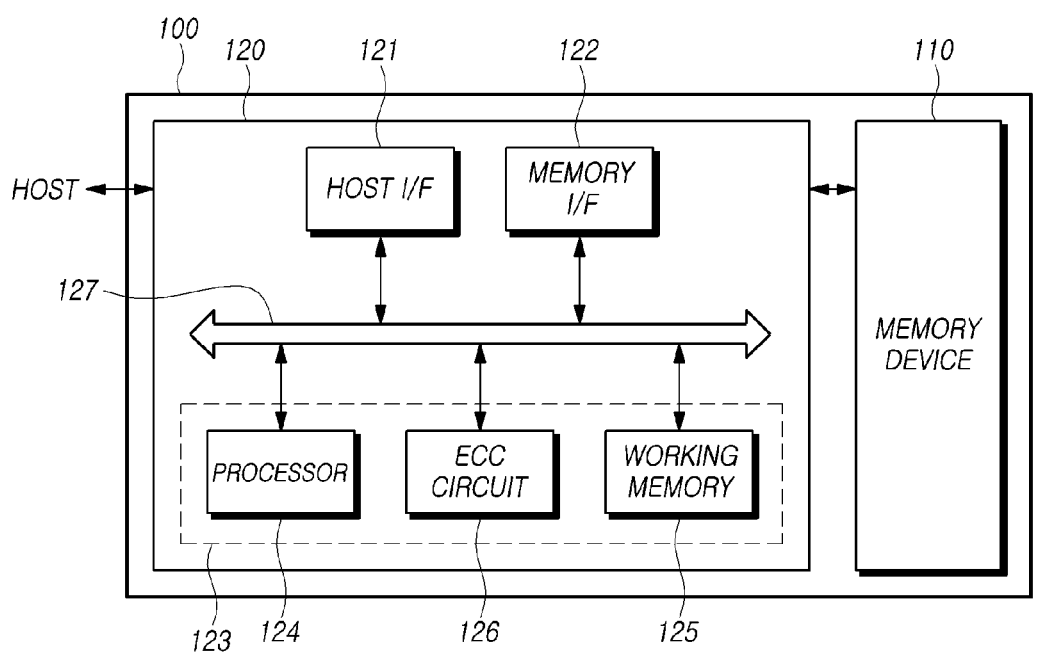
FIG. 1 is a schematic diagram illustrating a configuration of a memory system according to an embodiment of the present disclosure.

FIG. 1 is a diagram illustrating the schematic configuration of a memory system 100 according to an embodiment of the present disclosure.

Referring to FIG. 1, the memory system 100 may include a memory device 110 configured to store data, and a memory controller 120 configured to control the memory device 110.

The memory device 110 may include multiple memory blocks. The memory device 110 may be configured to operate in response to control signals received from the memory controller 120. Operations of the memory device 110 may include, for example, a read operation, a program operation (also referred to as a write operation), an erasure operation, and the like.

The memory device 110 may include a memory cell array including multiple memory cells (also simply referred to as cells) configured to store data. The memory cell array may exist inside a memory block.

For example, the memory device 110 may be implemented as any of various types, such as a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Embodiments of the present disclosure are applicable not only to a flash memory device having an electric charge storage layer configured as a conductive floating gate, but also to a flash memory device having a charge trap flash (CTF) having an electric charge storage layer configured as an insulating film.

The memory device 110 may be configured to receive a command and an address from the memory controller 120 and to access an area of the memory cell array selected using the address. That is, the memory device 110 may perform an operation corresponding to the received command in a memory area of the memory device having a physical address corresponding to the received address from the memory controller 120.

For example, the memory device 110 may perform a program operation, a read operation, an erasure operation, and the like. During the program operation, the memory device 110 may program data in the area selected by the address. During the read operation, the memory device 110 may read data from the area selected by the address. During the erasure operation, the memory device 110 may erase data stored in the area selected by the address.

The memory controller 120 may control write (program), read, erasure, and background operations with regard to the memory device 110. The background operation may include, for example, a garbage collection operation (GC), a wear leveling (WL) operation, and/or a bad block management (BBM) operation.

The memory controller 120 may control the operation of the memory device 110 at the request of a host. Alternatively, the memory controller 120 may control the operation of the memory device 110 without a corresponding request of the host, such as, for example, when the memory controller 120 performs one or more background operations of the memory device.

The memory controller 120 and the host may be separate devices. In some cases, the memory controller 120 and the host may be integrated and implemented as a single device. In the following description, the memory controller 120 and the host are separate devices.

Referring to FIG. 1, the memory controller 120 may include a memory interface 122, a control circuit 123, and a host interface 121.

The host interface 121 may be configured to provide an interface for communication with the host.

When receiving a command from the host (HOST), the control circuit 123 may receive the command through the host interface 121 and may perform an operation of processing the received command.

The memory interface 122 may be connected to the memory device 110 to provide an interface for communication with the memory device 110. That is, the memory interface 122 may be configured to provide the memory device 110 and the memory controller 120 with an interface in response to a control of the control circuit 123.

The control circuit 123 may be configured to control the operation of the memory device 110 by performing operations for overall control of the memory controller 120. For example, the control circuit 123 may include a processor 124 and a working memory 125. The control circuit 123 may further include an error detection/correction circuit (ECC circuit) 126 and the like.

The processor 124 may control overall operation of the memory controller 120. The processor 124 may perform a logical operation. The processor 124 may communicate with the host through the host interface 121. The processor 124 may communicate with the memory device 110 through the memory interface 122.

The processor 124 may perform a function of a flash translation layer (FTL). The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, according to the mapping unit. Typical address mapping methods include a page mapping method, a block mapping method, and a hybrid mapping method.

The processor 124 may be configured to randomize data received from the host. For example, the processor 124 may randomize data received from the host by using a randomizing seed. The randomized data is provided to the memory device 110 to be stored, and is programmed in the memory cell array.

The processor 124 may be configured to derandomize data received from the memory device 110 during a read operation. For example, the processor 124 may derandomize data received from the memory device 110 by using a derandomizing seed. The derandomized data may be output to the host.

The processor 124 may execute firmware (FW) to control the operation of the memory controller 120. In other words, the processor 124 may control overall operation of the memory controller 120 and, in order to perform a logical operation, may execute (drive) firmware loaded into the working memory 125 during booting.

The firmware refers to a program executed inside the memory system 100, and may include various functional layers.

For example, the firmware may include a flash translation layer (FTL) configured to translate between a logical address that the host requests from the memory system 100 and a physical address of the memory device 110, a host interface layer (HIL) configured to interpret a command that the host HOST issues to the memory system 100 (storage device) and to deliver the same to the FTL, and/or a flash interface layer (FIL) configured to deliver a command issued by the FTL to the memory device 110.

For example, the firmware may be stored in the memory device 110, then loaded into the working memory 125.

The working memory 125 may store firmware, program codes, commands, or pieces of data to drive the memory controller 120. The working memory 125 may include, for example, a static RAM (SRAM), a dynamic RAM (DRAM), and/or a synchronous RAM (SDRAM) as a volatile memory.

The error detection/correction circuit 126 may be configured to detect error(s) in target data by using an error correction code, and to correct detected error bit(s). For example, the target data may be stored in the working memory 125, data retrieved from the memory device 110, or the like.

The error detection/correction circuit 126 may be implemented to decode data by using the error correction code. The error detection/correction circuit 126 may be implemented by using various code decoders. For example, a decoder that performs nonsystematic code decoding or a decoder that performs systematic code decoding may be used.

For example, the error detection/correction circuit 126 may detect error bit(s), sector by sector, with regard to each piece of read data. That is, each piece of read data may include multiple sectors. As used herein, a sector may refer to a data unit smaller than the read unit (page) of a flash memory. Sectors constituting each piece of read data may correspond to each other via an address.

The error detection/correction circuit 126 may calculate a bit error rate (BER) and determine whether or not correction can be made sector by sector. For example, if the BER is higher than a reference value, the error detection/correction circuit 126 may determine that the corresponding sector is uncorrectable or "a fail". If the BER is less than or equal to the reference value, the error detection/correction circuit 126 may determine that the corresponding sector is correctable or "a pass".

The error detection/correction circuit 126 may perform error detection and correction operations successively with regard to all pieces of read data. When a sector in the read data is correctable, the error detection/correction circuit 126 may omit the error detection and correction operations related to the corresponding sector with regard to the next piece of read data. After finishing error detection and correction operations with regard to all pieces of read data in this manner, the error detection/correction circuit 126 may detect a sector deemed uncorrectable. There may be one or more sectors deemed uncorrectable. The error detection/correction circuit 126 may deliver information (for example, address information) regarding the sectors deemed uncorrectable to the processor 124.

The bus 127 may be configured to provide a channel between the constituent elements 121, 122, 124, 125, and 126 of the memory controller 120. The bus 127 may include, for example, a control bus for delivering various types of control signals and commands, and a data bus for delivering various types of data.

The above-mentioned constituent elements 121, 122, 124, 125, and 126 of the memory controller 120 are only provided as examples. It is noted that one or more of the above-mentioned constituent elements 121, 122, 124, 125, and 126 of the memory controller 120 may be omitted, or one or more of such constituent elements may be integrated into a single element. In addition, in some cases, one or more other constituent elements may be added to the memory controller 120, in addition to the above-mentioned constituent elements.

Hereinafter, the memory device 110 is described in more detail with reference to FIG. 2.

Figure 2:
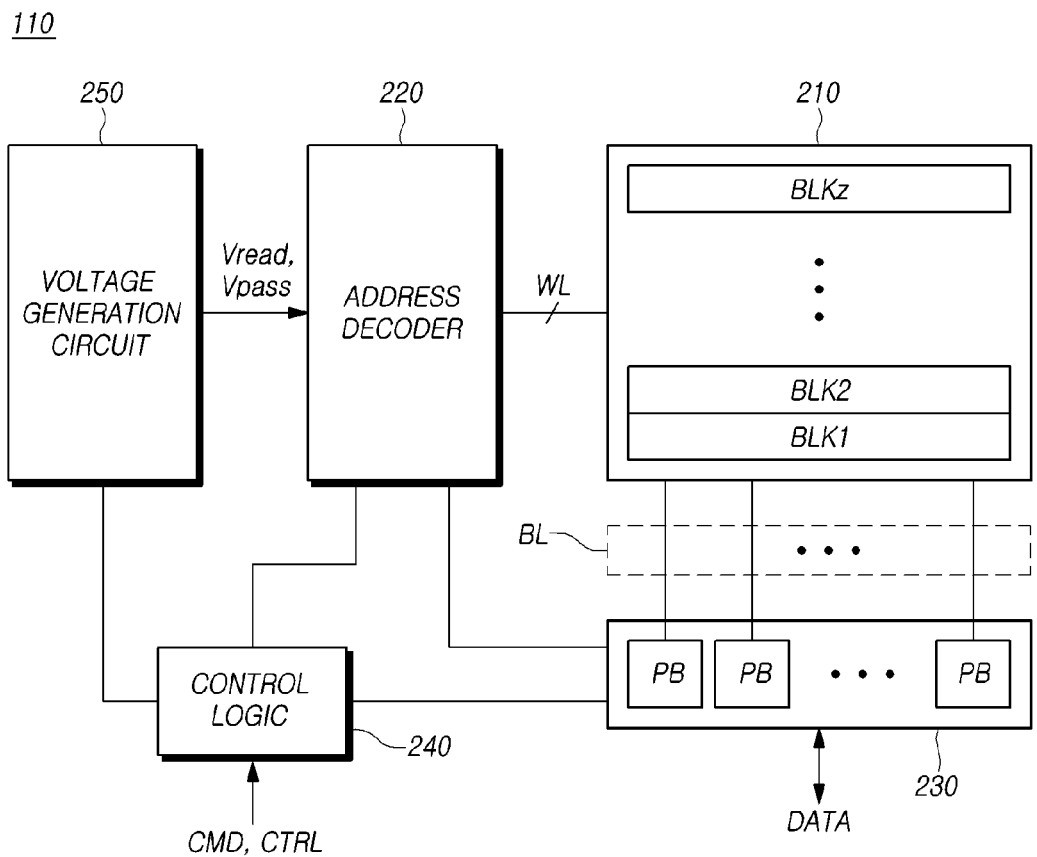
FIG. 2 is a block diagram schematically illustrating a memory device according to an embodiment of the present disclosure.

FIG. 2 is a block diagram schematically illustrating a memory device 110 according to an embodiment of the present disclosure.

Referring to FIG. 2, the memory device 110 according to an embodiment of the present disclosure may include a memory cell array 210, an address decoder 220, a read/write circuit 230, control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed, and multiple memory cells MC may be arranged at intersections thereof.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells, and may include nonvolatile memory cells having a vertical channel structure.

The memory cell array 210 may be configured as a memory cell array having a two-dimensional structure and, in some cases, may be configured as a memory cell array having a three-dimensional structure.

Each of the multiple memory cells included in the memory cell array 210 may store at least one bit of data. For example, each of the multiple memory cells in the memory cell array 210 may be a single-level cell (SLC) configured to store one bit of data, a multi-level cell (MLC) configured to store two bits of data, a triple-level cell (TLC) configured to store three bits of data, or a quad-level cell (QLC) configured to store four bits of data. As another example, the memory cell array 210 may include multiple memory cells, each of which may be configured to store five or more bits of data. Typically, all memory cells in a memory cell array are of the same level, although this is not a requirement.

Referring to FIG. 2, the address decoder 220, the read/write circuit 230, the control logic 240, and the voltage generation circuit 250 may collectively operate as a peripheral circuit configured to drive the memory cell array 210.

The address decoder 220 may be connected to the memory cell array 210 through the multiple word lines WL.

The address decoder 220 may be configured to operate in response to a control of the control logic 240.

The address decoder 220 may receive addresses through an input/output buffer inside the memory device 110. The address decoder 220 may be configured to decode a block address among the received addresses. The address decoder 220 may select at least one memory block according to the decoded block address.

The address decoder 220 may receive a read voltage Vread and a pass voltage Vpass from the voltage generation circuit 250.

The address decoder 220 may apply the read voltage Vread to a selected word line WL inside a selected memory block when applying the read voltage during a read operation, and may apply the pass voltage Vpass to the remaining non-selected word lines WL.

The address decoder 220 may apply a verification voltage generated by the voltage generation circuit 250 to a selected word line WL inside a selected memory block during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include any of a block address, a row address, and a column address.

The address decoder 220 may select one memory block and one word line according to the block address and the row address. The column address may be decoded by the address decoder 220 and provided to the read/write circuit 230.

The address decoder 220 may include a block decoder, a row decoder, a column decoder, and/or an address buffer.

The read/write circuit 230 may include multiple page buffers PB. The read/write circuit 230 may operate as a read circuit when the memory cell array 210 performs a read operation, and may operate as a write circuit when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some cases, may further include a cache buffer that operates in a caching function.

The multiple page buffers PB may be connected to the memory cell array 210 through the multiple bit lines BL. In order to sense the threshold voltage Vth of the memory cells during a read operation and a program verification operation, the multiple page buffers PB may continuously supply a sensing current to the bit lines BL connected to the memory cells, may sense, through a sensing node, a change in the amount of current that flows according to the program state of a corresponding memory cell, and may latch the same as sensing data.

The read/write circuit 230 may operate in response to page buffer control signals output from the control logic 240.

During a read operation, the read/write circuit 230 senses data in a memory cell, temporarily stores the retrieved data, and outputs the data (DATA) to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control overall operation of the memory device 110 in response to the control signal CTRL. The control logic 240 may output a control signal for adjusting the pre-charge potential level of sensing nodes of multiple page buffers PB.

The control logic 240 may control the read/write circuit 230 to perform a read operation in the memory cell array 210. The voltage generation circuit 250 may generate a read voltage Vread and a pass voltage Vpass, which are used during the read operation, in response to a voltage generation circuit control signal output from the control logic 240.

A memory block BLK included in the memory device 110 may consist of multiple pages PG and multiple strings. The multiple pages PG correspond to multiple word lines WL, and the multiple strings STR correspond to multiple bit lines BL.

In the memory block BLK, multiple word lines WL and multiple bit lines BL may be arranged to intersect. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

The multiple word lines WL and the multiple bit lines BL may intersect with each other, thereby defining multiple memory cells MC. Each memory cell MC may have a transistor TR arranged therein.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some cases, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
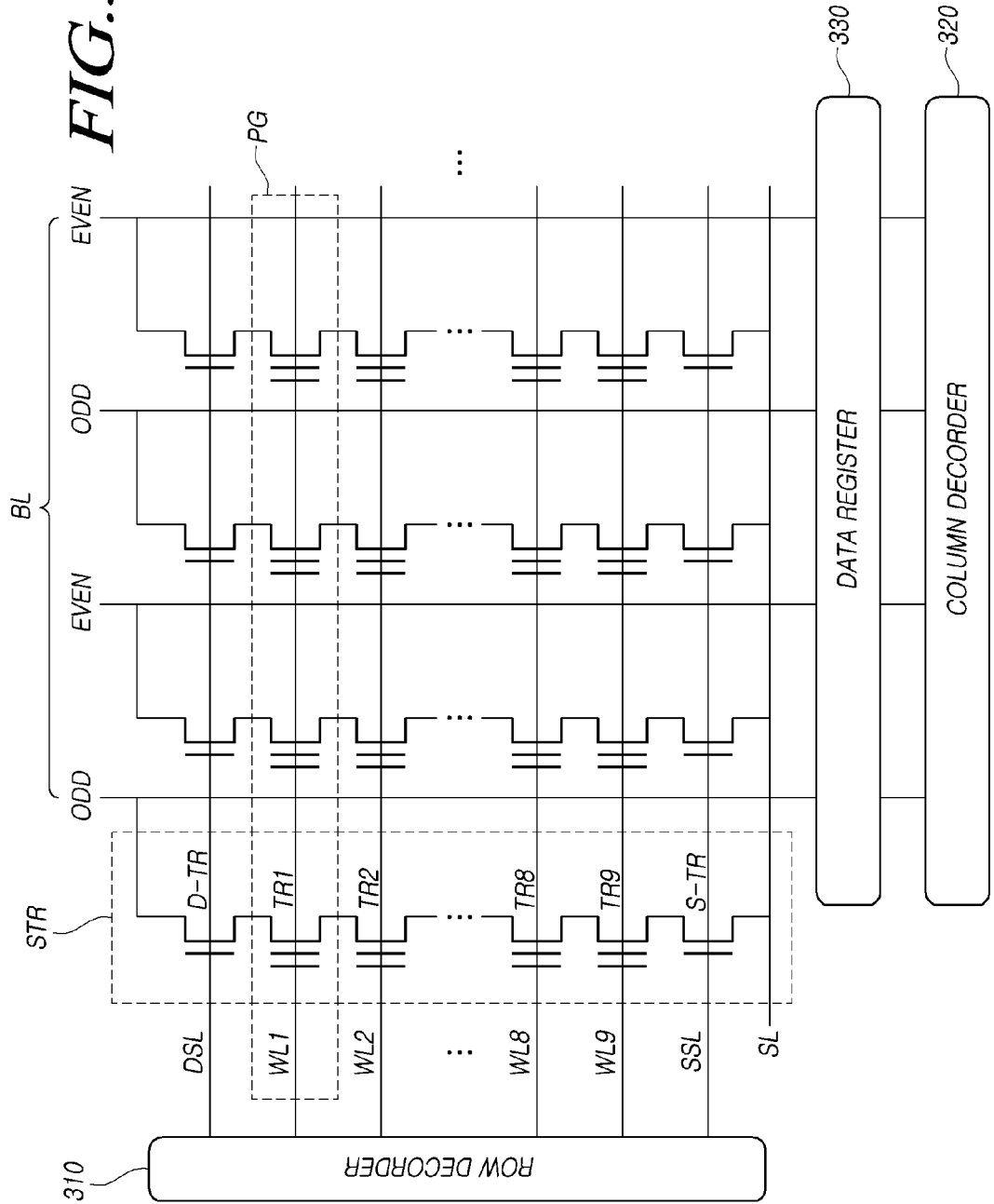
FIG. 3 is a diagram illustrating a structure of word lines and bit lines of a memory device according to an embodiment of the present disclosure.

FIG. 3 is a diagram illustrating a structure of word lines WL and bit lines BL of a memory device 110 according to an embodiment of the present disclosure.

Referring to FIG. 3, the memory device 110 has a core area in which memory cells MC are concentrated, and an auxiliary area which corresponds to the remaining (non-core) area. The auxiliary area supports the operations of the memory cell array 210.

The core area may include pages PG and strings STR. In the core area, multiple word lines WL1-WL9 and multiple bit lines BL are arranged to intersect.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (for example, two or four) pages PG. Each page PG is the smallest unit in connection with conducting a program operation and a read operation, and all memory cells MC within the same page PG may perform simultaneous operations when conducting a program operation and a read operation.

The multiple bit lines BL may be connected to the column decoder 320 while being distinguished between odd-numbered bit lines BL and even-numbered bit lines BL.

For accessing a memory cell MC, the address may be entered to the core area first through the input/output end and then through the row decoder 310 and the column decoder 320 such that a corresponding target memory cell can be designated. As used herein, designating a target memory cell refers to accessing one of the memory cells MC at the sites of intersection between the word lines WL1-WL9 connected to the row decoder 310 and the bit lines BL connected to the column decoder 320, for programming data therein or for reading programmed data therefrom.

Pages PG in a first direction (for example, X-axis direction) are bound by a commonly used line referred to as a word line WL, and strings STR in a second direction (for example, Y-axis direction) are bound (connected) by a common line referred to as a bit line BL. As used herein, being commonly bound refers to being structurally connected by the same material and simultaneously receiving the same voltage during voltage application. The voltage applied to a memory cell MC positioned upstream or up line among memory cells MC connected in series may slightly differ from the voltage applied to a downstream or down line memory cell MC due to the voltage drop across the preceding memory cell(s) MC.

The data register 330 plays an important role because all data processing by the memory device 110, including program and read operations, occurs via the data register 330. If data processing by the data register 330 is delayed, all of the other areas need to wait until the data register 330 finishes the data processing. In addition, degradation of performance of the data register 330 may degrade overall performance of the memory device 110.

Referring to the example illustrated in FIG. 3, in one string STR, multiple transistors TR1-TR9 may be connected to multiple word lines WL1-WL9. The multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 in terms of the signal path among the two outermost word lines WL1 and WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR plays the role of a switch that turns on or off the connection between the corresponding string STR and the data register 330. The second selection transistor S-TR plays the role of a switch that turns on or off the connection between the corresponding string STR and the source line SL. That is, the first selection transistor D-TR and the second selection transistor S-TR play the role of gatekeepers which are positioned at opposite ends of the corresponding string STR and deliver/block signals.

During a program operation, the memory system 100 fills the target memory cell MC of the bit line BL which is to be programmed with electrons. Accordingly, the memory system 100 applies a turn-on voltage Vcc to the gate electrode of the first selection transistor D-TR, thereby turning on the first selection transistor D-TR, and applies a turn-off voltage (for example, 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may supply a voltage (for example, +20V) to the substrate through a source line SL during an erasure operation. The memory system 100 floats both the first selection transistor D-TR and the second selection transistor S-TR during an erasure operation, thereby generating an infinite resistance. As a result, the effect of the first selection transistor D-TR and that of the second selection transistor S-TR may be removed, and electrons may operate only between the floating gate FG and the substrate due to the potential difference.

Figure 4:
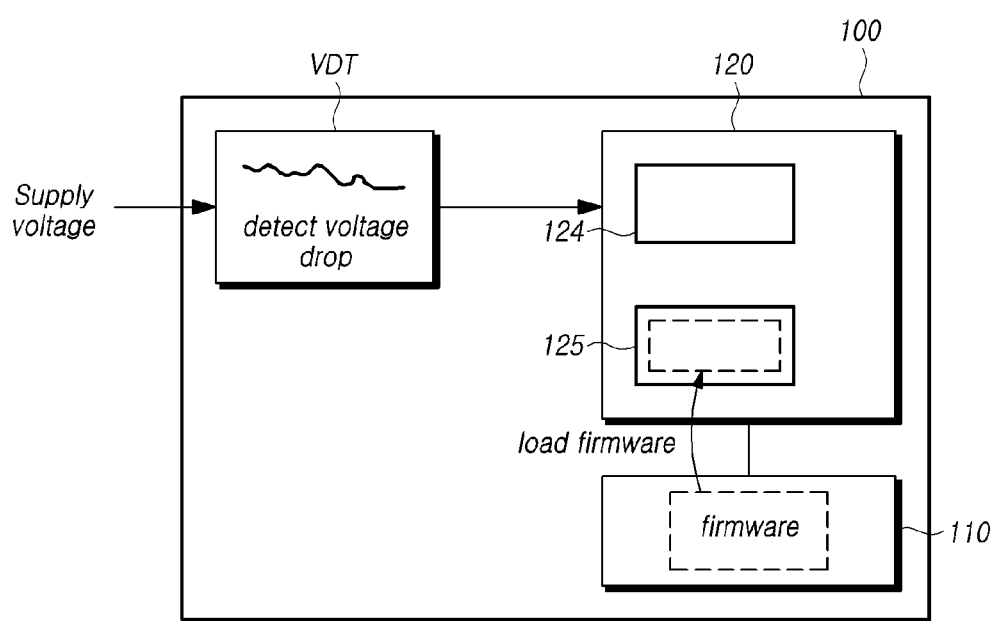
FIG. 4 is a diagram illustrating operation of a memory system according to an embodiment of the present disclosure.

FIG. 4 is a diagram illustrating the operation of a memory system according to an embodiment of the present disclosure.

Referring to FIG. 4, the memory system 100 may include a voltage drop detector VDT for detecting the level of a supply voltage supplied to the memory system 100. Although it is shown by way of example in FIG. 4 that the voltage drop detector VDT is disposed within the memory system 100, the invention is not limited to that arrangement. In another embodiment, the voltage drop detector VDT may be external to the memory system 100.

The voltage drop detector VDT may measure a change in the level of the supply voltage over time. The voltage drop detector VDT may detect the level of the supply voltage over time, and may convert the same from an analog value to a digital value.

In addition, the voltage drop detector VDT may detect a voltage drop pattern pertaining to the level of the supply voltage, and may transmit information on the detected voltage drop pattern to the memory controller 120.

The information on the voltage drop pattern may be transmitted to the memory controller 120 in the form of a set command or signal, or may be transmitted to the memory controller 120 through a method of storing a value in a status register.

As described above, the processor 124 of the memory controller 120 may execute (drive) firmware loaded from the memory device 110 to the working memory 125 at the time of booting in order to control overall operation of the memory controller 120 and perform logical operations.

The processor 124 of the memory controller 120 may drive the firmware loaded into the working memory 125, may receive information on the voltage drop pattern transmitted from the voltage drop detector VDT, and may execute a processing operation according to the voltage drop pattern.

Figure 5:
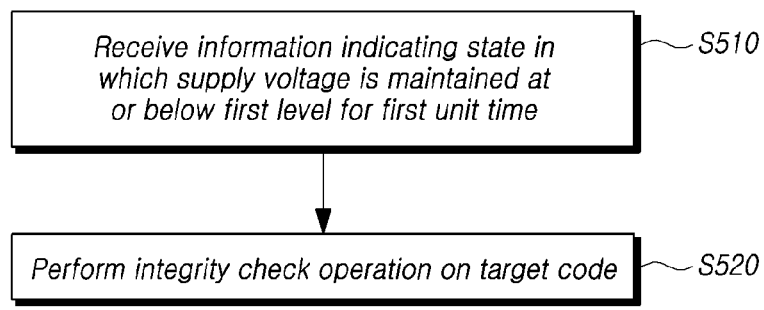
FIG. 5 is a flowchart illustrating an example in which a memory controller performs an integrity check operation according to an embodiment of the present disclosure.

FIG. 5 is a flowchart illustrating an example in which a memory controller 120 performs an integrity check operation according to an embodiment of the present disclosure.

The memory controller 120 may receive, from the voltage drop detector VDT, information indicating whether the supply voltage is maintained at or below a first level (e.g., 1.7 V) for a first unit time (S510).

When the memory controller 120 receives, from the voltage drop detector VDT, information indicating whether the supply voltage is maintained at or below a first level for a first unit time, the memory controller 120 may perform an integrity check operation on target code (S520). In this case, the target code may be code stored in the memory device 110 or code stored in a separate read-only memory (e.g., ROM).

In embodiments of the present disclosure, if supply voltage is maintained at or below a first level during a first unit time, it is likely that a bit-flip will occur in the process of reading the target code due to instability of the supply voltage and thus the memory controller 120 may perform an integrity check operation.

A bit-flip in the target code is caused by the instability of the supply voltage resulting from consumption of transient peak current, but it is impossible to accurately predict when the peak current will occur. Therefore, it is difficult for the memory controller 120 to accurately determine the time at which the bit-flip will occur. In addition, the memory system 100 has no hardware capable of automatically correcting a bit-flip in the target code.

Therefore, the memory controller 120 may perform an integrity check operation on the target code if there is a high possibility of a bit-flip occurring in the target code, and if a bit-flip occurs, the memory controller 120 may correct the same through software. Accordingly, the memory controller 120 may quickly detect a bit-flip occurring in the target code, and may minimize or reduce the time of operation in the state in which the bit-flip occurs in the target code.

Depending on the result of the integrity check operation on the target code, an error handling operation may be performed on the target code, as described with reference to FIG. 8. For example, when it is determined not to perform the error handling operation as a result of the integrity check operation, the memory controller 120 may execute the target code after completing the integrity check operation.

In this case, the algorithm used for the integrity check operation may be, for example, a checksum-type algorithm using SHA, MD5, or the like. As another example, the algorithm used in the integrity check operation may be an algorithm for calculating parity on the basis of a result value of an XOR operation performed on bit values of the target code.

Figure 6:
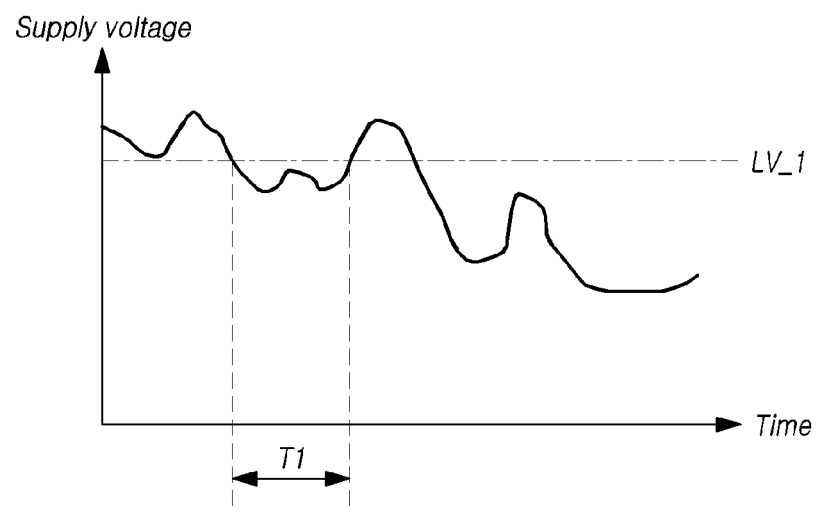
FIG. 6 is a diagram illustrating a condition in which a memory controller performs an integrity check operation on target code according to an embodiment of the present disclosure.

FIG. 6 is a diagram illustrating a condition in which a memory controller 120 performs an integrity check operation on target code according to an embodiment of the present disclosure.

Referring to FIG. 6, a voltage drop detector VDT may detect a change in the supply voltage over time. If the voltage drop detector VDT detects that the supply voltage measured during a first unit time T1 is maintained at or below a first level LV_1, the memory controller 120 may perform an integrity check operation on the target code.

However, if the supply voltage is only temporarily equal to or less than the first level LV_1 during T1, the memory controller 120 does not perform the integrity check operation on the target code. That is, the integrity check operation is not performed unless the supply voltage is equal to or less than the first level LV_1 during the entirety of T1. In another embodiment, T1 may be greater than shown in FIG. 6, in which case the supply voltage would have to remain at or below LV_1 for that greater period of time.

Figure 7:
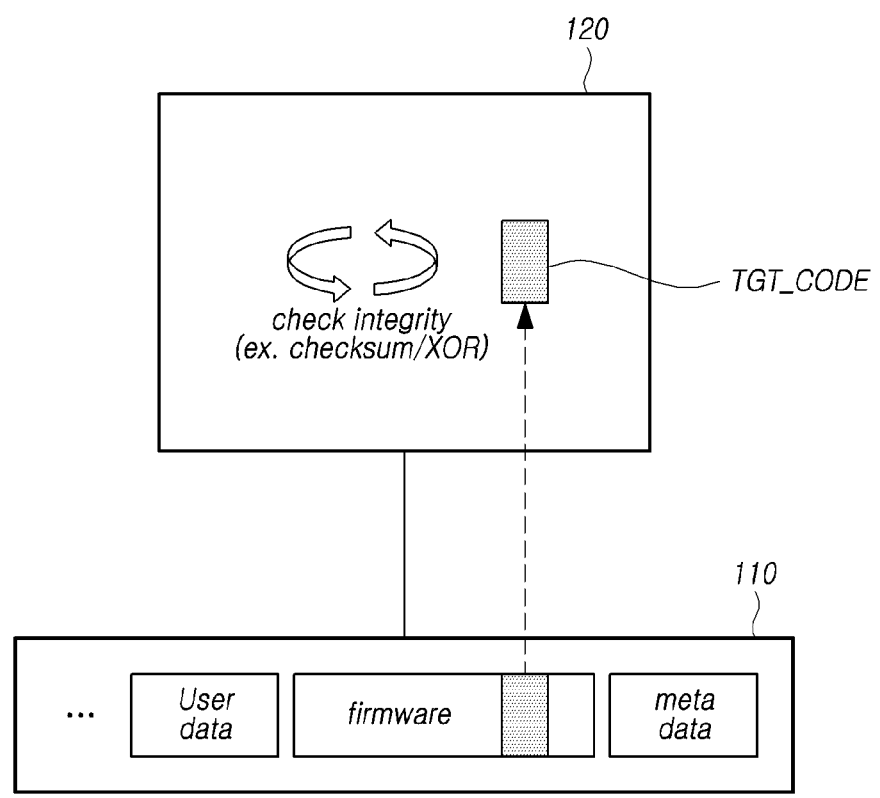
FIG. 7 is a diagram illustrating an example of target code.

FIG. 7 is a diagram illustrating an example of target code.

Referring to FIG. 7, target code TGT_CODE may be firmware code stored in the memory device 110. In embodiments of the present disclosure, the reason why firmware code is selected as the target code TGT_CODE from among various types of data (e.g., user data, meta-data, and the like) stored in the memory device 110 is as follows.

If a bit-flip occurs in firmware code, the firmware is likely to operate abnormally, so the probability that abnormal data will be written to the memory device 110 also increases.

Once abnormal data is written to the memory device 110, the region where the data is written is no longer recoverable. Therefore, in order to prevent malfunction of the firmware, the memory controller 120 may perform an integrity check operation on firmware code if there is a possibility of a bit-flip occurring therein.

On the other hand, if the operation of the firmware stops when a bit flip occurs, there is a possibility of losing data stored in the volatile memory in the memory system 100. However, it is possible to restore the data through a set recovery process after the memory system 100 is reset.

Figure 8:
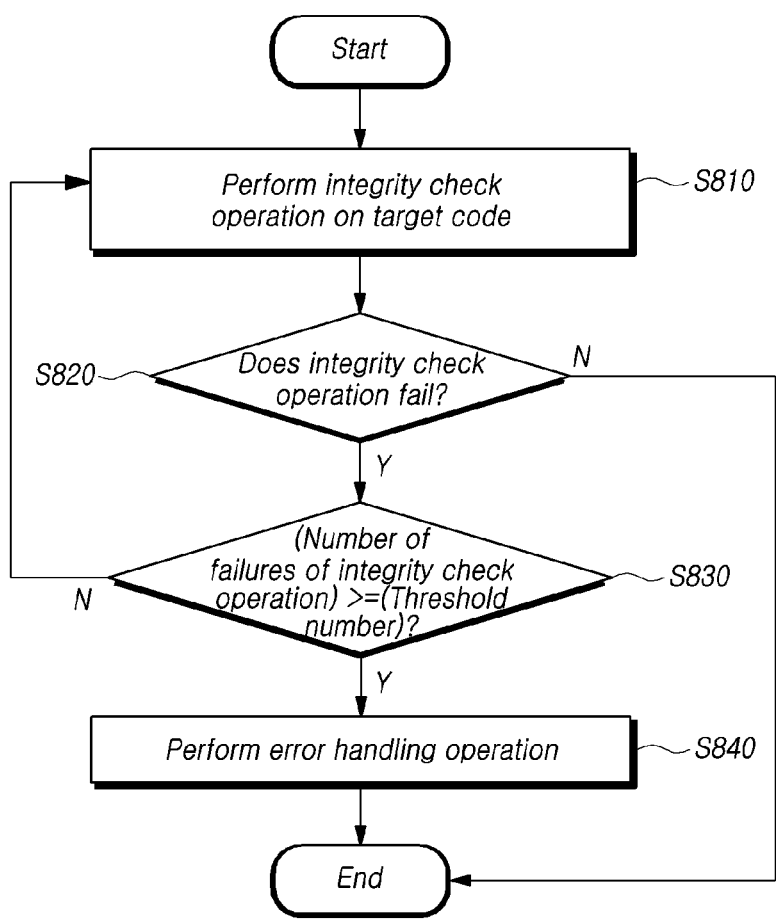
FIG. 8 is a flowchart illustrating operation of a memory controller according to an embodiment of the present disclosure.

FIG. 8 is a flowchart illustrating operation of a memory controller 120 according to an embodiment of the present disclosure.

Referring to FIG. 8, the memory controller 120 may perform an integrity check operation on target code TGT_CODE (S810).

Thereafter, the memory controller 120 determines whether or not the integrity check operation on the target code TGT_CODE has failed (S820).

If the integrity check operation on the target code TGT_CODE failed ("Y" in S820), the memory controller 120 determines whether or not the number of times the integrity check operation on the target code TGT_CODE failed is greater than or equal to a set threshold number of times, e.g., 3 or 5, (S830).

If the number of times the integrity check operation on the target code TGT_CODE failed is less than the set threshold number ("N" in S830), the memory controller 120 may repeat step S810. This is due to the fact that there is a high probability of the target code TGT_CODE being normally read without a bit-flip when the memory controller 120 reads the target code TGT_CODE again because the bit-flip occurring in the target code TGT_CODE is a temporary phenomenon.

On the other hand, if the number of times the integrity check operation on the target code TGT_CODE failed is greater than or equal to the set threshold number ("Y" in S830), the memory controller 120 may perform an error handling operation in S840 in order to prevent malfunction of the firmware. This is due to the fact that the possibility of malfunction of the firmware increases because the bit-flip occurring in the target code TGT_CODE is not a temporary phenomenon.

The error handling operation may be triggered by the host (HOST). That is, if the memory system 100 transmits, to the host, information indicating that an error will occur or is likely to occur during the operation of the firmware using a command or a signal, the host may trigger a specific error handling operation in order to prevent malfunction of the firmware.

In this case, the error handling operation may be an operation of correcting an error, an operation of discarding the target code in which an error occurs, an operation of recording a log of the error in the memory device 110, an operation of initializing the memory system 100, and the like.

For example, the error handling operation may be an operation of stopping the execution of the firmware. If it is determined that there is no way to prevent malfunction of the firmware, the memory system 100 may stop execution of the firmware, and may perform a reset operation.

As another example, the error handling operation may be an operation of correcting an error occurring in the target code. If it is determined that the error occurring in the target code is correctable through software, the memory system 100 may correct the error occurring in the target code, instead of stopping the execution of the firmware.

The memory controller 120 may determine whether or not to perform the error handling operation depending on the number of times the integrity check operation failed, as described above, or may determine whether or not to perform the error handling operation on the basis of the information received from the voltage drop detector VDT described above.

Figure 9:
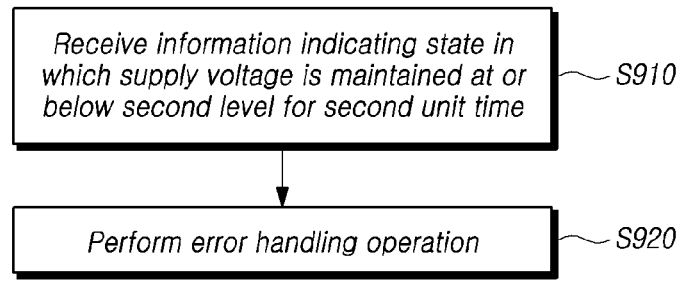
FIG. 9 is a flowchart illustrating an example in which a memory controller performs an error handling operation according to an embodiment of the present disclosure.

FIG. 9 is a flowchart illustrating an example in which the memory controller 120 performs an error handling operation according to an embodiment of the present disclosure.

Referring to FIG. 9, the memory controller 120 may receive, from a voltage drop detector VDT, information indicating whether a supply voltage is maintained at or below a second level (e.g., 1.42V) for a second unit time (S910). In this case, the second level is equal to or less than the aforementioned first level. That is, the information of S910 indicates a more severe situation than the information of S510.

When the information indicating that the supply voltage is maintained at or below a second level for a second unit time is received from the voltage drop detector VDT, the memory controller 120 may perform the above-described error handling operation (S920).

If the supply voltage is maintained at or below a second level for a second unit time, the firmware is likely to malfunction due to serious instability of the supply voltage, so the memory controller 120 may perform the error handling operation in order to prevent malfunction of the firmware.

Figure 10:
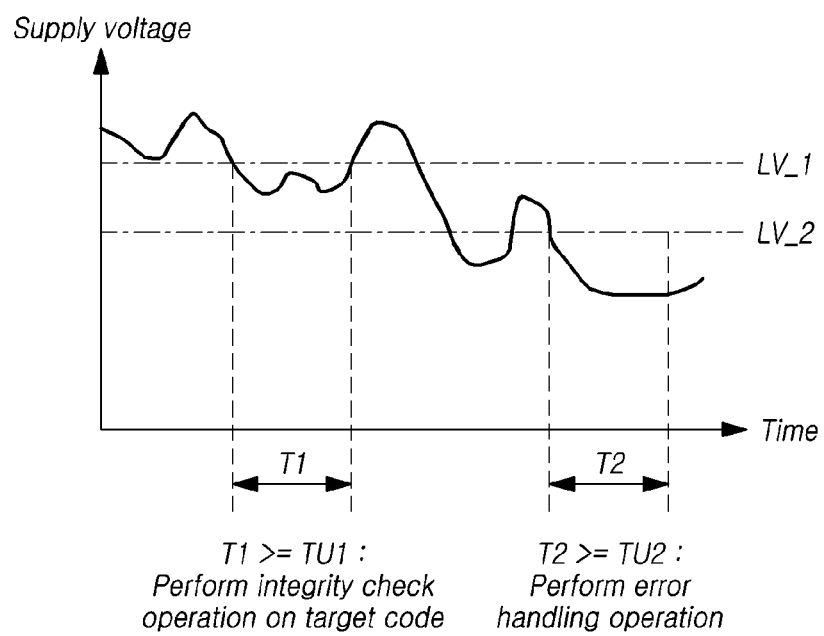
FIG. 10 is a diagram illustrating a condition in which a memory controller performs an error handling operation according to an embodiment of the present disclosure.

FIG. 10 is a diagram illustrating a condition in which a memory controller 120 performs an error handling operation according to an embodiment of the present disclosure.

Referring to FIG. 10, a voltage drop detector VDT may detect a change in the supply voltage over time. When the voltage drop detector VDT detects that the supply voltage measured during a second time T2, which is longer than second unit time TU2, remains at or below a second level LV_2, the memory controller 120 may perform an error handling operation. This may be performed separately from the integrity check operation performed by the memory controller 120 on the target code. That is, the memory controller 120 may perform an error handling operation when the number of times the integrity check operation on the target code failed is greater than or equal to the set threshold number or when the voltage drop detector VDT detects that the supply voltage measured during a second time T2 remains at or below a second level LV_2.

Figure 11:
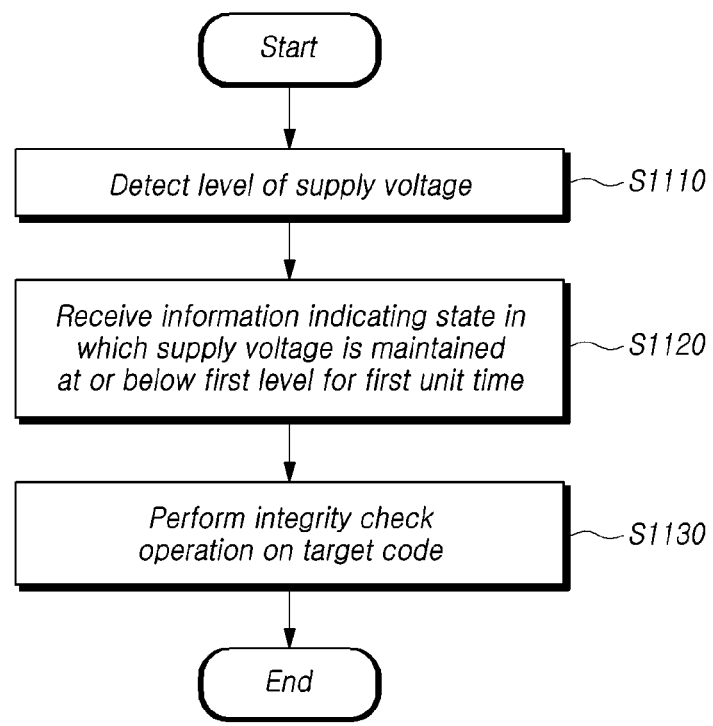
FIG. 11 is a flowchart illustrating a method of operating a memory system according to an embodiment of the present disclosure.

FIG. 11 is a flowchart illustrating a method of operating a memory system 100 according to an embodiment of the present disclosure.

The method of operating the memory system 100 may include detecting the level of a supply voltage supplied to the memory system 100 through a voltage drop detector VDT (S1110).

In addition, the method of operating the memory system 100 may include receiving, from a voltage drop detector VDT, information indicating whether the supply voltage is maintained at or below a first level for a first unit time (S1120).

In addition, the method of operating the memory system 100 may include performing an integrity check operation on the target code (S1130).

The method of operating the memory system 100 may further include performing an error handling operation if the number of times the integrity check operation on the target code fails is greater than or equal to a threshold number in order to prevent malfunction of the firmware.

The method of operating the memory system 100 may further include further performing the error handling operation if information, indicating that the supply voltage is maintained at or below a second level for a second unit time, is received from the voltage drop detector VDT. In this case, the second level may be less than or equal to the first level.

The operation of the memory controller 120 described above may be controlled by the control circuit 123, and may be performed by the processor 124 executing (driving) the firmware programmed to control overall operation of the memory controller 120.

Figure 12:
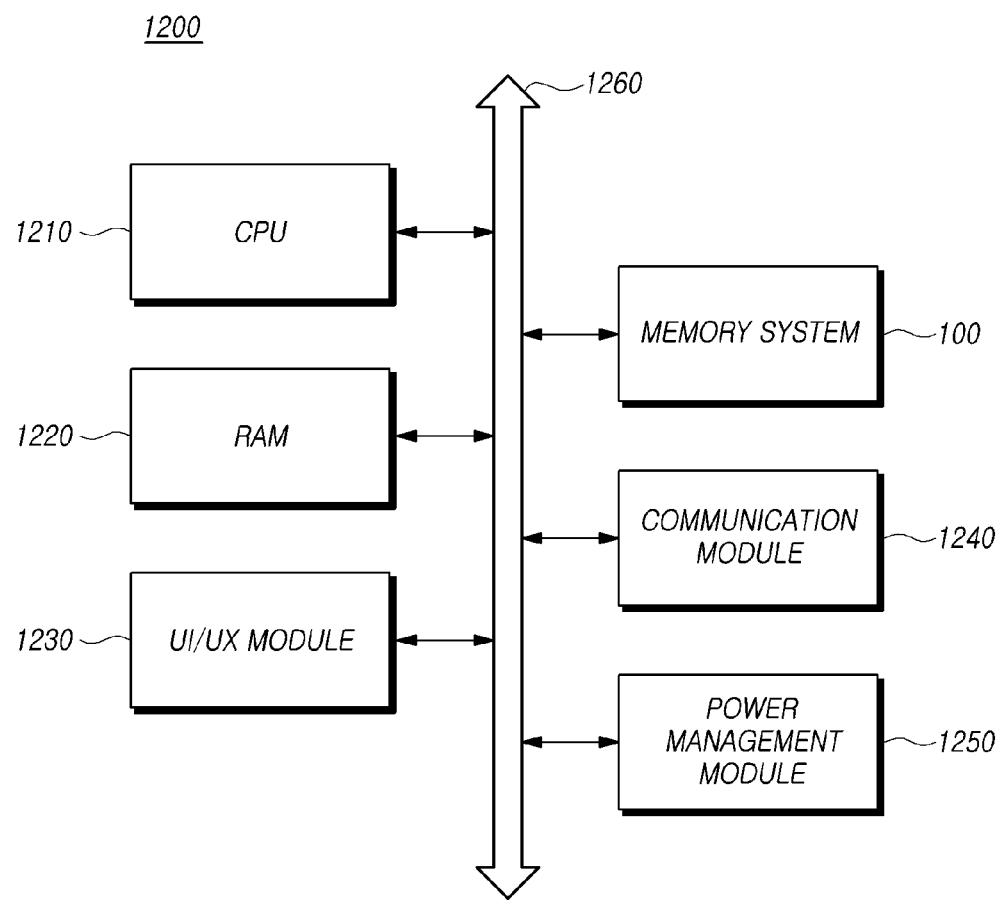
FIG. 12 is a diagram illustrating a configuration of a computing system according to embodiments of the present disclosure.

FIG. 12 is a diagram illustrating a configuration of a computing system 1200 according to an embodiment of the present disclosure.

Referring to FIG. 12, the computing system 1200 may include: a memory system 100 electrically connected to a system bus 1260; a CPU 1210 configured to control overall operation of the computing system 1200; a RAM 1220 configured to store data and information related to operations of the computing system 1200; a user interface/user experience (UI/UX) module 1230 configured to provide the user with a user environment; a communication module 1240 configured to communicate with an external device in a wired and/or wireless manner; and a power management module 1250 configured to manage power used by the computing system 1200.

The computing system 1200 may be a personal computer (PC) or may include a mobile terminal such as a smartphone, a tablet or any of various other electronic devices.

The computing system 1200 may further include a battery for supplying an operating voltage, and may further include an application chipset, a graphic-related module, a camera image processor, and a DRAM. Other elements may be included as would be apparent to a person skilled in the art.

The memory system 100 may include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and/or a ferroelectric RAM (FRAM). In addition, the memory system 100 may be implemented as any of various types of storage devices, any of which may be embodied in any of various electronic devices.

According to embodiments of the present disclosure described above, the operation delay time of the memory system may be reduced or minimized. In addition, according to an embodiment of the present disclosure, overhead occurring in the process of calling a specific function may be reduced or minimized. Although various embodiments of the present disclosure have been illustrated and described, those skilled in the art will appreciate that various modifications, additions and substitutions are possible, without departing from the scope and spirit of the invention as set forth in the accompanying claims. Therefore, while embodiments of the present disclosure have been described for the sake of brevity and clarity, the scope of the invention encompasses all variations that fall within the claims including their equivalents.

What is claimed is:

1. A memory system comprising:
a memory device; and
a memory controller configured to communicate with the memory device and execute firmware in order to control the memory device,
wherein the memory controller is further configured to perform an integrity check operation on target code when information indicating whether a supply voltage supplied to the memory system is maintained at or below a first level for a first unit time is received from a voltage drop detector configured to sense a level of the supply voltage,
wherein the memory controller is further configured to perform an error handling operation in order to prevent malfunction of the firmware when a number of times the integrity check operation on the target code fails is greater than or equal to a threshold number,
wherein the memory controller is configured to further perform the error handling operation, separately from the integrity check operation, when information indicating that the supply voltage is maintained at or below a second level for a second unit time is received from the voltage drop detector,
wherein the memory controller determines that it is likely that a bit-flip will occur in a process of reading the target code when the supply voltage is maintained at or below the first level during the first unit time, and
wherein the second level is less than the first level.

2. The memory system of claim 1, wherein the target code is firmware code.

3. The memory system of claim 1, wherein the error handling operation includes stopping the execution of the firmware.

4. The memory system of claim 1, wherein the error handling operation includes correcting an error occurring in the target code.

5. A memory controller comprising:
a memory interface configured to communicate with a memory device; and
a processor configured to communicate with the memory device through the memory interface and execute firmware in order to control the memory device, wherein the processor is further configured to perform an integrity check operation on target code when information indicating whether a supply voltage supplied to a memory system is maintained at or below a first level for a first unit time is received from a voltage drop detector configured to sense a level of the supply voltage, wherein the processor is further configured to perform an error handling operation in order to prevent malfunction of the firmware when a number of times the integrity check operation on the target code fails is greater than or equal to a threshold number, wherein the processor is configured to further perform the error handling operation when information indicating that the supply voltage is maintained at or below a second level for a second unit time is received from the voltage drop detector, wherein the processor determines that it is likely that a bit-flip will occur in a process of reading the target code when the supply voltage is maintained at or below the first level during the first unit time, and wherein the second level is less than the first level.

6. The memory controller of claim 5, wherein the target code is firmware code.

7. The memory controller of claim 5, wherein the error handling operation includes stopping the execution of the firmware.

8. The memory controller of claim 5, wherein the error handling operation includes correcting an error occurring in the target code.

9. A method of operating a memory system including a memory device, the method comprising:

detecting a level of a supply voltage supplied to the memory system through a voltage drop detector;

receiving, from the voltage drop detector, information indicating whether the supply voltage is maintained at or below a first level for a first unit time;

performing an integrity check operation on target code, and performing an error handling operation in order to prevent malfunction of the firmware when a number of times the integrity check operation on the target code fails is greater than or equal to a threshold number wherein the error handling operation is performed when information indicating that the supply voltage is maintained at or below a second level for a second unit time is received from the voltage drop detector, wherein the memory system determines that it is likely that a bit-flip will occur in a process of reading the target code when the supply voltage is maintained at or below the first level during the first unit time, and wherein the second level is less than the first level.

* * * * *